US006943557B2

(12) United States Patent
Wyar

(10) Patent No.: US 6,943,557 B2
(45) Date of Patent: *Sep. 13, 2005

(54) SYSTEM AND METHOD FOR PROVIDING A TIME VARYING GAIN TDR TO DISPLAY ABNORMALITIES OF A COMMUNICATION CABLE OR THE LIKE

(75) Inventor: Paul Wyar, Mount Airy, MD (US)

(73) Assignee: Acterna, LLC, Germantown, MD (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/663,019

(22) Filed: Sep. 16, 2003

(65) Prior Publication Data

US 2004/0061508 A1 Apr. 1, 2004

Related U.S. Application Data

(63) Continuation of application No. 09/916,379, filed on Jul. 27, 2001, now Pat. No. 6,653,844.

(51) Int. Cl.[7] .............................................. G01R 31/11
(52) U.S. Cl. ....................................................... 324/533
(58) Field of Search ................................ 324/522–527, 324/532–535, 541–551; 370/241, 248, 484, 228; 379/24–32; 342/165–174, 124, 118, 195, 332

(56) References Cited

U.S. PATENT DOCUMENTS

| 5,352,984 A | | 10/1994 | Piesinger |
| 5,461,318 A | | 10/1995 | Borchert et al. |
| 6,097,755 A | * | 8/2000 | Guenther et al. ........... 375/228 |
| 6,195,614 B1 | | 2/2001 | Kochan |
| 6,653,844 B2 | * | 11/2003 | Wyar ......................... 324/533 |
| 6,829,223 B1 | * | 12/2004 | Richardson et al. ........ 370/241 |

* cited by examiner

*Primary Examiner*—Tu T. Nguyen
(74) *Attorney, Agent, or Firm*—Reed Smith LLP

(57) ABSTRACT

In a system and method for testing and displaying the abnormalities, includes opens, shorts, bridged-taps and wet sections, of a copper pair line for xDSL service use, the abnormalities are amplified and normalized so as to be displayed within a predetermined observation range. The normalization steps include piecewise gaining and biasing the reflected pulse of various gains to create a first normalized reflected trace which match the reflected traces within a predetermined observation range and thereby constitute a total smooth curve; and amplifying the first normalized reflected trace according to a function of time to create a second normalized reflected trace so as to eliminate an exponential gain decay curve of a no-fault copper pair line with the same predetermined characteristic parameters from the first normalized reflected trace to thereby obtain a second normalized reflected trace showing any amplified abnormalities.

11 Claims, 17 Drawing Sheets

FIG. 4

| User Selected Gauge | User Selected Length | PW | 1st Segment | | | 2nd Segment | | | 3rd Segment | | |
|---|---|---|---|---|---|---|---|---|---|---|---|
| | | | Start Length | End Length | TDR_HW Gain (dB) | Start Length | End Length | TDR_HW Gain (dB) | Start Length | End Length | TDR_HW Gain (dB) |
| 19AWG | 0-6Kft | 250nS | 0 | 6,000 | 0 | na | na | na | na | na | na |
| 22AWG | 0-6Kft | 250nS | 0 | 5,000 | 0 | 4,000 | 6,000 | 12 | na | na | na |
| 24AWG | 0-6Kft | 250nS | 0 | 4,000 | 0 | 3,440 | 6,000 | 12 | na | na | na |
| 26AWG | 0-6Kft | 250nS | 0 | 3,000 | 0 | 2,400 | 6,000 | 12 | na | na | na |
| 19AWG | 7-9Kft | 469nS | 0 | 9,000 | 0 | na | na | na | na | na | na |
| 22AWG | 7-9Kft | 469nS | 0 | 8,000 | 0 | 7,200 | 9,000 | 12 | na | na | na |
| 24AWG | 7-9Kft | 469nS | 0 | 6,000 | 0 | 5,400 | 9,000 | 12 | na | na | na |
| 26AWG | 7-9Kft | 469nS | 0 | 5,000 | 0 | 4,500 | 8,000 | 12 | 7,200 | 9,000 | 24 |
| 19AWG | 10-13Kft | 1000nS | 0 | 13,000 | 0 | na | na | na | na | na | na |
| 22AWG | 10-13Kft | 1000nS | 0 | 11,000 | 0 | 8,800 | 13,000 | 12 | na | na | na |
| 24AWG | 10-13Kft | 1000nS | 0 | 9,000 | 0 | 8,100 | 13,000 | 12 | na | na | na |
| 26AWG | 10-13Kft | 1000nS | 0 | 7,000 | 0 | 6,300 | 11,000 | 12 | 9,900 | 13,000 | 24 |
| 19AWG | 14-18Kft | 3000nS | 0 | 18,000 | 0 | na | na | na | na | na | na |
| 22AWG | 14-18Kft | 3000nS | 0 | 18,000 | 0 | na | na | na | na | na | na |
| 24AWG | 14-18Kft | 3000nS | 0 | 15,000 | 0 | 13,500 | 18,000 | 12 | na | na | na |
| 26AWG | 14-18Kft | 3000nS | 0 | 11,000 | 0 | 9,900 | 16,000 | 12 | 14,400 | 18,00 | 24 |

| Gauge | Kg2@pw =250nS | Kg2@pw =469nS | Kg2@pw =1000nS | Kg2@pw =3000nS |
|---|---|---|---|---|
| 19 | 9,342 | 13,270 | 17,499 | 20,839 |
| 22 | 7,206 | 10,196 | 13,305 | 15,068 |
| 24 | 6,008 | 8,503 | 11,009 | 12,001 |
| 26 | 4,855 | 6,858 | 8,790 | 8,804 |

Length in kft

| Wire Gauge | Offset_ 2nd_Norm pw=250nS | Offset_ 2nd_Norm @pw=469nS | Offset_ 2nd_Norm @pw=1000nS | Offset_ 2nd_Norm @pw=3000nS |
|---|---|---|---|---|
| 19 | 50,600 | 71,877 | 94,785 | 112,879 |
| 22 | 39,035 | 55,229 | 72,067 | 81,621 |
| 24 | 32,541 | 46,057 | 59,634 | 65,005 |
| 26 | 26,297 | 37,147 | 47,613 | 47,690 |

| Gauge | Kg3@pw<br>=250nS | Kg3@pw<br>=469nS | Kg3@pw<br>=1000nS | Kg3@pw<br>=3000nS |
|---|---|---|---|---|
| 19 | 6,988 | 15,605 | 20,667 | 48,647 |
| 22 | 5,390 | 11,991 | 15,713 | 35,176 |
| 24 | 4,494 | 9,999 | 13,002 | 28,015 |
| 26 | 3,631 | 8,065 | 10,381 | 20,553 |

SYSTEM AND METHOD FOR PROVIDING A TIME VARYING GAIN TDR TO DISPLAY ABNORMALITIES OF A COMMUNICATION CABLE OR THE LIKE

CROSS REFERENCE TO RELATED APPLICATION

This is a continuation application of U.S. Ser. No. 09/916,379, filed on Jul. 27, 2001, now U.S. Pat. No. 6,653,844, which is incorporated herein by reference.

BACKGROUND OF THE INVENTION

1. Field of the Invention

The present invention related to a system and method for providing a time varying gain TDR to display abnormalities in a communication and telephone cable or the like by normalizing the levels of the reflected signals corresponding to a predetermined observation range. The communication cable can be any copper pair line that can be used for IDSL, ADSL, HDSL, SDSL, SHDSL, and VDSL communication usage, as well as all other DSL-type technologies (hereinafter, "xDSL" indicating all the various DSL technologies and line codings).

2. Description of the Prior Art

Internet access providers, cable communication companies, etc. are constantly working to fill demands for real-time internet access through the installation of fiber-optic and other hi-speed communications lines. However, in many areas of the country, such equipment and the services to support that equipment are either impractical to implement, prohibitively costly, or simply not scheduled to occur in the foreseeable future.

Telephone companies have tried to fill part of the demand by offering Digital Subscriber Line (xDSL) services that use the current infrastructure of copper pair lines to deliver hi-speed access to the Internet. Lines that work fine for standard telephone communication do not always work for different types of DSL operation.

The definition of copper pair lines includes any communication line made of copper or other similar material or composition known in the art. The proper conditions have to exist in order for a copper pair line to handle xDSL communications. The efficiency of a copper pair line for XDSL service is dependent on factors such as the length of the telephone line, the number of bridge taps on the line, material defects or shorts in the line, the wire gauge of the line, damage to the lines, proximity of sources of electro-magnetic energy, etc.

Time Domain Reflectometers or TDRs are in common use in testing the abnormality of telephone and coaxial cables, such the TDR described in U.S. Pat. No. 5,461,318 to Borchert et al. (Oct. 24, 1995) which is a method for detecting impedance discontinuities in a two-conductor cable. However, using conventional TDk techniques, this process involves sending service technicians to the ends of a physical line then analyzing the received signal via a local switch. As one can imagine, this entire process is time consuming, labor intensive and costly.

TDRs detect fault anomalies such as opens, shorts, bridged-taps and wet sections. As these lines become longer the loss of the line is higher and it becomes increasingly harder to detect these anomalies. In most cases it takes considerable training and practice to discriminate between these various anomalies. Often even the most experienced telephone technician must drive to other locations, disconnecting sections to resolve their problems.

One key factor in differentiating between a short, a wet section and bridged-tap is the size of the return trace. "Trace" is a graphical representation of the line voltage verse time. However since the size of this return trace is related to the cable type and distance, or in other words the cable loss (with the return trace decreasing in amplitude as the distance increases), there is no existing method used to definitely resolve these common cable plant problems. Loss with cable plants of mixed cable types, makes detection for these faults even more complex. Detecting multiple faults at different lengths cannot be done on the same trace, as the user must manually set the gain for only a particular range of interest.

Another factor that masks the faults is a phenomenon called back-scatter decay. As cables become longer this returning signal becomes dominant over any detectable fault. Manual gain and offset controls are often required to see faults at longer distances. The user of a traditional TDR have to manually change the gain on the TDR trace in order to see the faults.

Therefore, there currently exists a need for a system and method to test the abnormalities of the copper pair lines that avoids the displaying problems and limitations associated with the current techniques. There also exists a need for a system and method to test the abnormalities of the copper pair lines that can aid in automatically showing abnormalities within a predetermined observation range so as to make the tracing and repair of copper pair lines for xDSL service more efficient.

Time Varying Gain ("TVG"), a predetermined gain versus time relationship, has been applied in side scanning sonar systems for mapping the topography of a under water seabed. Acoustic tone bursts (pings) are transmitted through the water column toward a target area and return from the target area are picked up by a receiver transducer and processed for display. Return signals may vary due to unknowns such as temperature, salinity and clarity of the water column. If bottom returns are involved, such as in side looking sonar systems, different bottom types such as mud, sand or rock will return different signals. For instance, U.S. Pat. No. 4,198,702 to Clifford (Apr. 15, 1980) describes a time varying gain amplifier for a side scanning sonar system having a predetermined gain versus time relationship. The gain is substantially proportional to the square of the elapsed time measured from the last sonar trace initiating trigger signal.

U.S. Pat. No. 5,392,257 to Gilmour (Feb. 21, 1995) further provides a sonar receiver with a normalizing processor circuit to modify/normalize the reflected signals to be displayed within the same range by adjusting gain levels. Normalizing processor circuit means is provided and is adapted to receive the signals reflected from unknowns in the water column and various bottom types, and the means is operable to generate an average error signal as a function of time. This error signal is applied to modify the output of the time varying gain circuit.

Adjusting gain levels is common in the art of data processing, and it has been applied to an optical time domain reflectometer ("OTDR") in an optical measurement instrument. U.S. Pat. No. 4,893,006 to Wakai et al. (Jan. 9, 1990) applies such a level adjusting function to an OTDR which works in conjunction with an optical fiber. The optical time domain reflectometer tests a target optical fiber by sending an optical trace to the target optical fiber and detecting Fresnel reflection light and backscattered light returning from the fiber. A level changing means changes the level of the electric signal corresponding to a predetermined location of observation range so as to avoid saturation of the electric signal in the amplifier. As another example, U.S. Pat. No. 5,929,982 to Anderson (Jul. 27, 1999) applies such a level adjusting function (gain control) to an OTDR for optimizing the gain of an active avalanche photo-diode ("APD"). Any system noise is compared to a threshold value for establishing the optimum bias for optimum gain of the APD thereby to increase the dynamic range of the OTDR.

However, the application of TVG to a TDR for telephone lines of the present invention is unique, and the application simplifies the use of TDR in testing for abnormalities in telephone and coaxial cables and enables the display of multiple faults at various cable lengths. In addition, detecting multiple faults at different lengths can be done on the same trace automatically.

SUMMARY OF THE INVENTION

It is therefore a general object of the present invention to provide an TDR with Time Varying Gain so as to display the abnormalities of a communication cable or the like in a predetermined observation range.

Another object is to display a reflected trace in predetermined amplitude, regardless of actual amplitude due to cable loss or cable length for a particular given fault (open, short, bridge-tap or wet section). In addition, multiple faults at various lengths can be seen on a single screen.

Another object is to provide a simple method and apparatus for interpreting TDR traces which will then require less user training.

A further object is to eliminate backscatter slope and to highlight faults.

A further object is to easily determine cable type by how well the back-scatter is matched. Further, if a user enters the incorrect wire type, some back-scatter slope will be present, and thus can be corrected. Accordingly, mixed cable types can be identified and compensated for and the need for user intervention in selecting gain manually is eliminated.

A further object is to provide an improved method and apparatus for detecting a physical bridge tap and distinguishing the bridge tap from other types of cable fault.

The present invention involves a copper pair line abnormalities testing apparatus, procedure and protocol. First, parameters such as each copper pair line's length, wire gauge, impedance, etc. are known, entered in the apparatus, or measured using known measuring techniques. Next, using a time varying gain domain reflectometer (TDR), a known signal or pulse is transmitted through the line; the central offices (CO) or customer premise equipment (CPE) can be used as the origin or starting point of the trace signal. The return voltage is measured, wherein impedance mismatches are identified by the characteristics of that return voltage. For example, with a time varying gain TDR device having a display, impedance and wire gauge mismatches can be identified visually by the presence of significant scope or amplitude changes in the graphical representation of the return voltage. The time varying gain TDR's graphical representations or trace, along with information from other measurements, or manually entered, is normalized to eliminate the effects of the loose cable, namely attenuation and backscatter. The normalization steps will then generate graphical representation indicative of the characteristics of the abnormalities of the copper pair line, wherein the abnormalities may beindividually graphically represented in a predetermined observation range. The normalization steps are used to amplify the abnormalities in conjunction with the time interval of the TDR traces and at least one gain coefficient factor.

In accordance with one embodiment of the present invention, a system for displaying abnormalities of a copper pair line comprising at least one time varying gain time domain reflectometer (TDR) having supplying means for supplying at least one pulse of energy at a given pulse width on to a base location of the copper pair line; receiving means for receiving the reflected pulse at the base location; measuring means for measuring the elapsed time from the transmission of the pulse to the receipt of the reflected pulse corresponding to the transmitted pulse; calculating means for calculating the distance from the base location to a abnormality causing the reflected pulse; piecewise gaining and biasing means for piecewise gaining biasing the reflected pulse of various gains to create a first normalized reflected trace which match the reflected pulse of various gains within a predetermined observation range and constitute as one smooth curve; a first time varying gain circuit for amplifying said first normalized reflected trace according to a function of time to create a second normalized reflected trace so as to eliminate an exponential gain decay curve of a no-fault copper pair line with the same predetermined characteristic parameters from said first normalized reflected trace to thereby obtain a second normalized reflected trace showing any amplified abnormalities; and a display for displaying at least one of the reflected trace, the first and second normalized traces corresponding to a predetermined observation range. The abnormalities includes opens, shorts, bridged-taps and wet sections on the wire.

According to a further embodiment of the present invention, a system as described further comprises a second time varying gain circuit for amplifying said second normalized reflected trace according to a function of time to create a third normalized reflected trace so as to amplify the abnormalities thereby to differentiate different types of abnormalities.

BRIEF DESCRIPTION OF THE DRAWINGS

The accompanying drawings are included to provide an understanding of the invention and constitute a part of the specification.

FIG. 4 is a hardware gain and offset table.

DETAILED DESCRIPTION OF THE PREFERRED EMBODIMENTS

The present invention is based on the development of a system for analyzing the structural and functional abnormalities of a copper pair line for xDSL service. By implementing the apparatus, methodology and protocol of the present invention, one can in a step-by-step process progressively test and trace the location and extent of the abnormalities without physically visiting the site.

Figure 1:
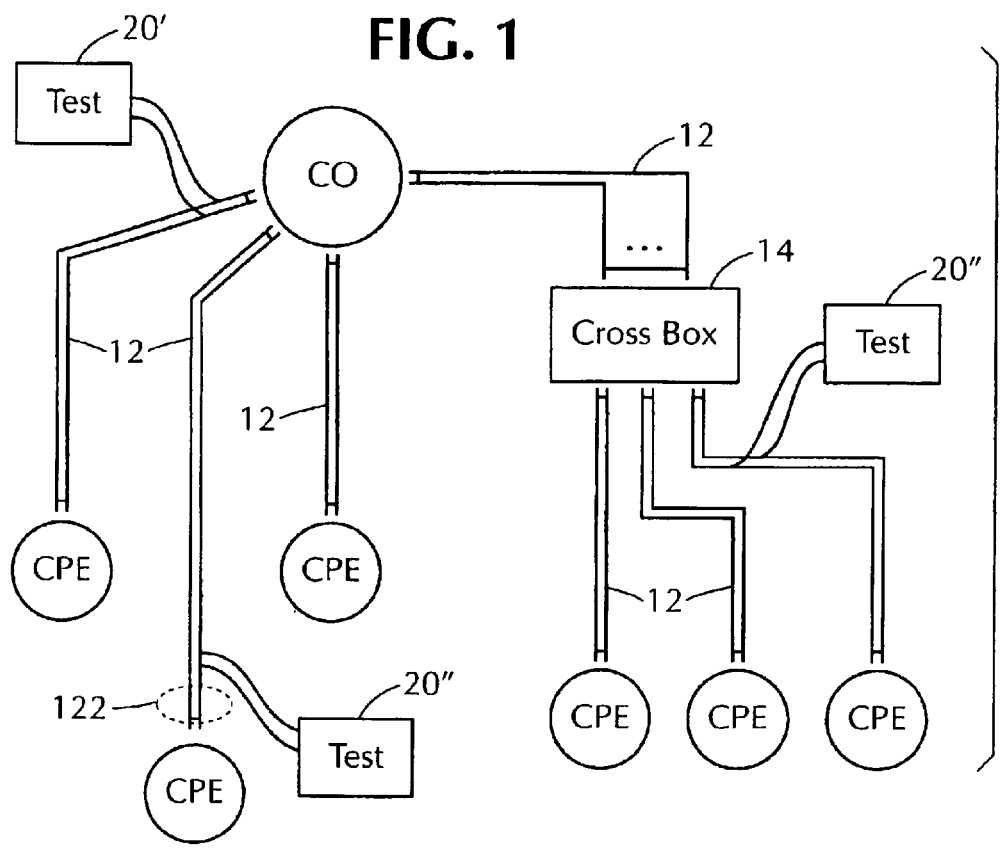
FIG. 1 is a system block diagram of a preferred implementation and application of the present invention.

FIG. 1 illustrates a system block diagram of the testing environment of the present invention. In particular, a conventional telephone system that would be tested using the present invention would incorporate a central office or exchange CO through which a plurality of copper pair lines 12 are connected and processed. Each copper pair line would be composed of a cable loop pair 122 that has a CO end and a CPE end. Each cable loop pair terminates at a CPE end; a CPE is generally embodied in the copper pair lines that connect into individual homes or offices within proximity of the CO.

From either its CO end or the CPE end, a cable loop pair 122 is tested using test equipment 20' or 20"; test equipment 20' is the system implemented at the CO end; while equipment 20" is implemented at the CPE end. Applicants have found that the testing of the copper pair lines at the CPE end generates more accurate predictions of the suitability of the copper pair lines for xDSL service due to the difficulties relating to extended length attenuation, dispersions and interfering noise (i.e., disturbers). Alternatively, test equipment 20" can be implemented at a cross-box 14 of the copper pair lines. This would allow a user to test the lines so as to be able to qualify each of the copper pair lines for an entire neighborhood or for all the offices in a building. This alternative, like the testing at the CPE end, has been found to produce more accurate test results. However, testing of the lines at the CO is equally valid as that done at either the CPE end or at a cross-box of the copper pair lines, although more challenging.

Figure 2A:
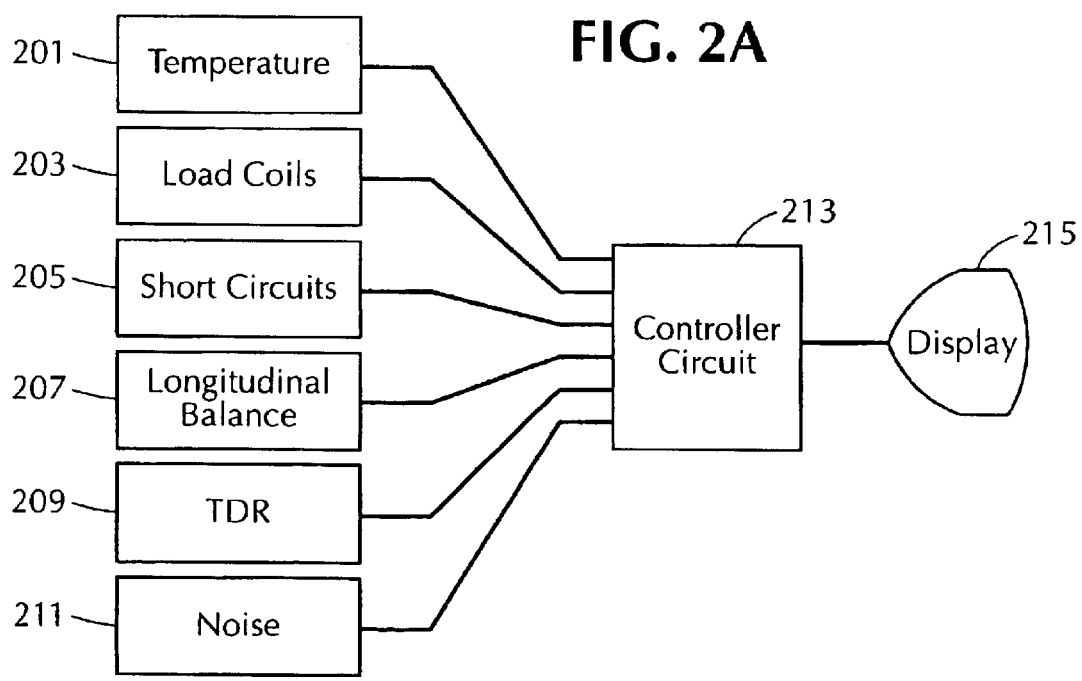
FIG. 2A is a system block diagram of the structural and operational components of the preferred embodiments of the present invention.

As shown in FIG. 2A, both test equipment 20' and 20" generally consist of components for, among others, (1) measuring the ambient temperature of the copper pair line 201; (2) detecting the presence of abnormalities 203; (3) detecting the presence of short circuits 205; (4) conducting a longitudinal balance test 207; (5) conducting time domain reflectometry 209 on the line; and (6) determining the presence of wideband noise on the copper pair line 211. In a preferred embodiment of the present invention, each of the above components are implemented into a single test instrument or system so as to make the conducting of the tests more efficient and portable. The structure and operation of those individual components would be consistent with similar devices known in the art. However, as one of skill in the art would understand, these components could also be implemented using a combination of known test devices or systems that are either interconnected or simply applied separately in sequence.

For example, component 201 for measuring the temperature of the copper pair line may consist of a conventional thermocouple device or other industrial temperature gauge. Applicants have found that, since the temperature of the copper pair line may vary along its length and as a result of environmental conditions at any point along the line, one way of including temperature as a factor in the analysis is by using the ambient temperature of the overall surrounding environment. For example, with copper pair lines that are suspended above the ground, the surrounding air temperature is used.

Component 203 for detecting the presence of abnormalities, such as load coils, build out capacitors, may consist of a conventional signal transceiver device capable of at least sweeping test signals through a plurality of frequencies or "bins" by generating a signal at each of the frequency bins and detecting a test signal resulting from the generated signal.

Short circuits in the copper pair line may be detected by component 205 using a conventional ohmeter, multimeter or other resistance measuring device designed for telecommunications applications.

Longitudinal balance testing by component 207 would be accomplished using any conventional voltage or current measuring device capable of measuring the common mode AC voltage or current, and the differential AC voltage or current in a copper pair line.

Time domain reflectometry would be implemented in component 209 using a time domain reflectometer, using either a time domain or a frequency domain algorithm. To save having a separate component in the system for determining the presence of short circuits in the copper pair lines, the function of component 205 may also be performed by component 209 since, as is known in the art, time domain reflectometry can be used to determine the presence of short circuits in metallic paired cables. Noise in the copper pair lines would be measured by component 211 using an analog receiver connected to an A/D converter so as to generate a digital representation of any noise signals it detects.

In testing for abnormalities on the line, component 209 implemented as a TDR device is used to transmit pulse along the copper pair line. Return reflections of that known pulse which show the resulting attenuation of the pulse through a copper pair line are indicative of various conditions, including the presence or absence of short circuits, the presence or absence of open circuits, the presence or absence of bridge taps, changes in the wire gauge of the line, the presence of water, and the length of the copper pair line. The existence and/or degree of existence of these conditions are in turn indicative of the line's capacity to handle xDSL service.

By tracking the time at which the trace is transmitted in comparison to the time at which a reflected trace is received by the TDR, the length of the copper pair line may be predicted based on the known velocity of electromagnetic energy (i.e., the speed of light) and the known velocity of propagation (VOP) through a copper wire of a known gauge and having an ideal or known impedance.

Figure 3:
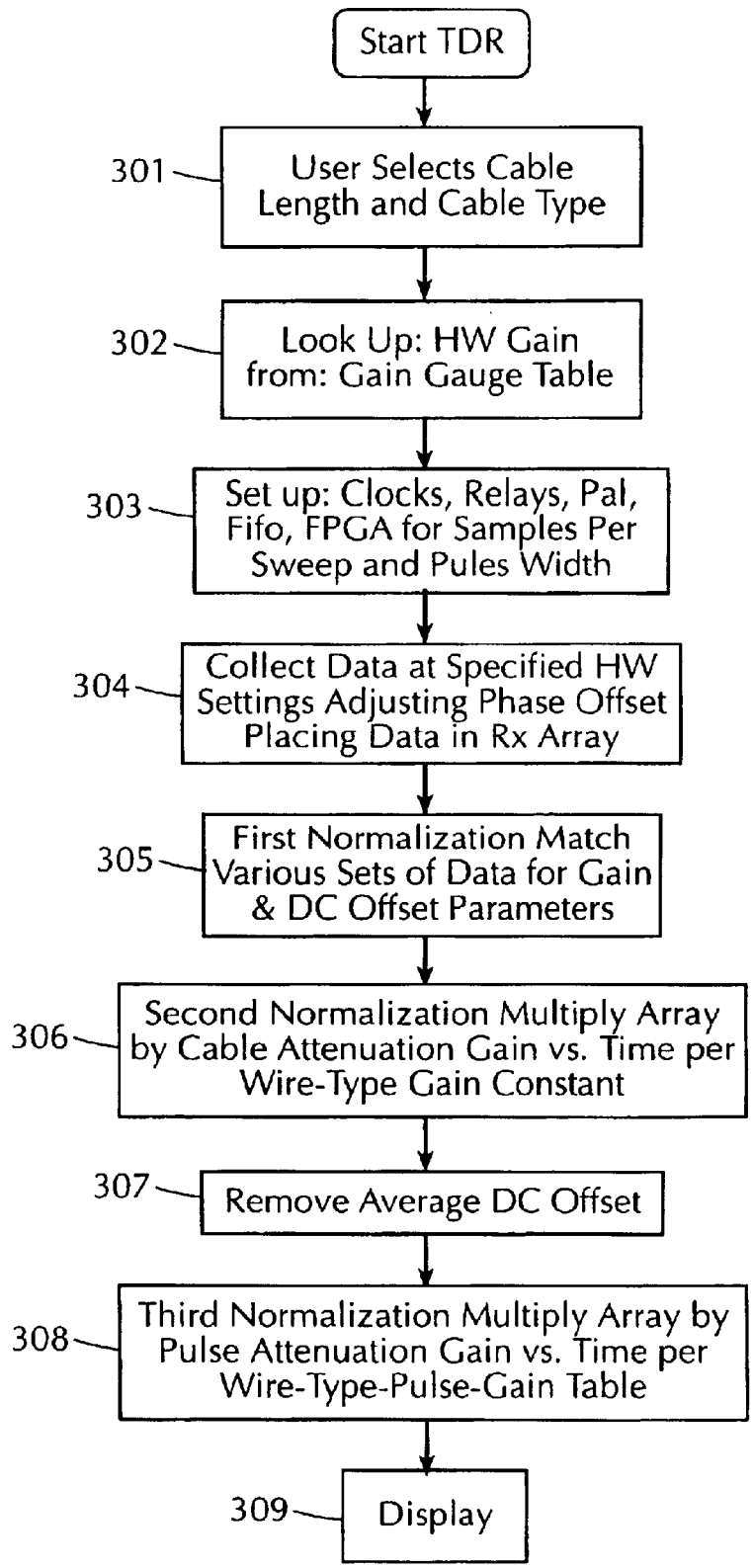
FIG. 3 is a flow diagram of the general steps that comprise the protocol for conducting the testing of abnormalities in a copper pair line according to the present invention; while the shaded boxes representing traditional TDR SW routines.

In the general operation of the invention, the protocol for conducting the abnormality test, as illustrated in FIG. 3, involves the following steps to be executed by the user or automatically via hardware and/or software:

Step 301: A User selects cable length and cable type (such parameters may further include line, impedance, the wire gauge, temperature of the line and cable construction type).

Step 302: Determining hardware (HW) gain and DC offset data from a Gain Gauge Table as shown in FIG. 4; this corresponds with using the data from selecting cable length and cable type.

Step 303: Setting up clocks, relays, programmable array logic (PAL), field programmable gate array (FPGA) samples per sweep and trace width.

Step 304: Sending and receiving data at HW settings specified in Steps 302 and 303, adjusting phase offset, and placing data in Rx array.

Figure 5A:
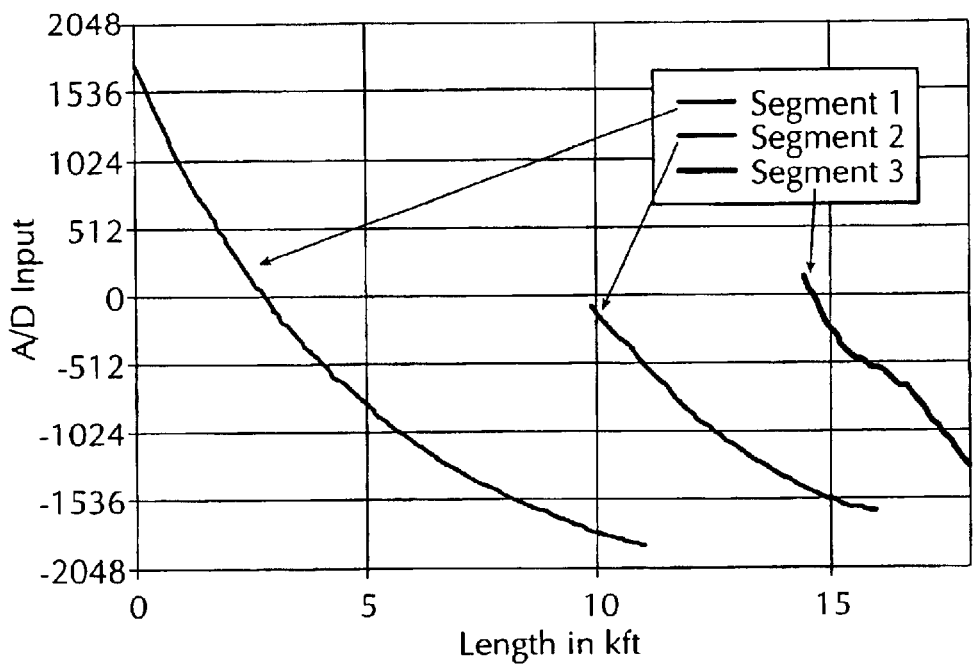
FIG. 5A shows a graphical representation of three sets 12 bit reflected data from abnormalities of a copper pair line piecewise matched into one set of 16 bit data of the present invention.
Figure 5B:
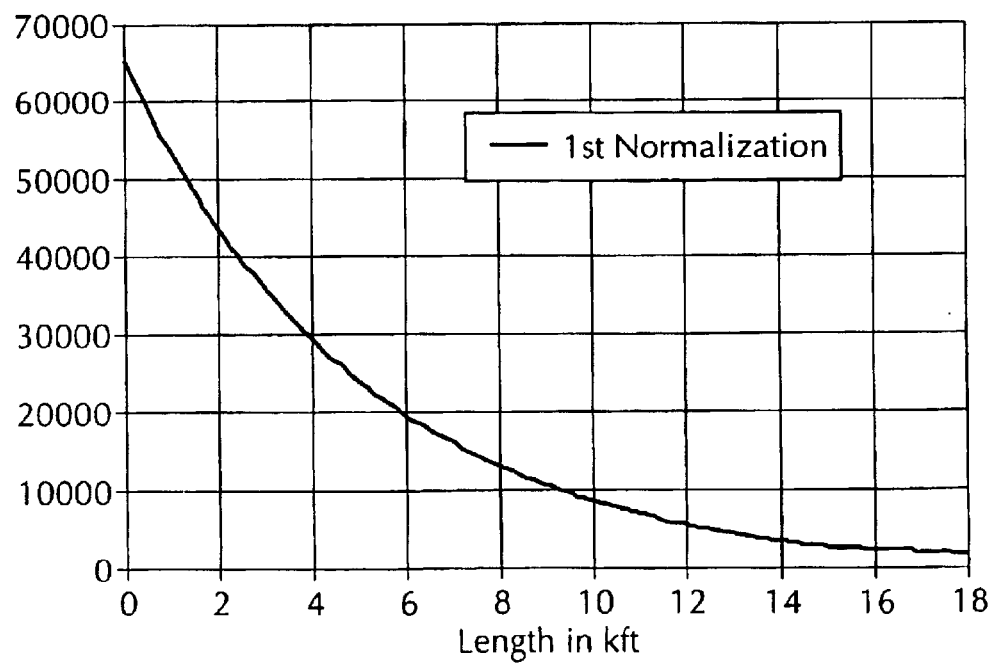
FIG. 5B shows a graphical representation of the results of the First Normalization.

Step 305: First Normalization: comparing the reflected traces of various gains with a predetermined observation range to set gain and DC offset so as to bias the levels of the reflected pluses to be shown as one approximately smooth curve within the predetermined observation range as shown in FIG. 5B.

Figures 6A, 6B:
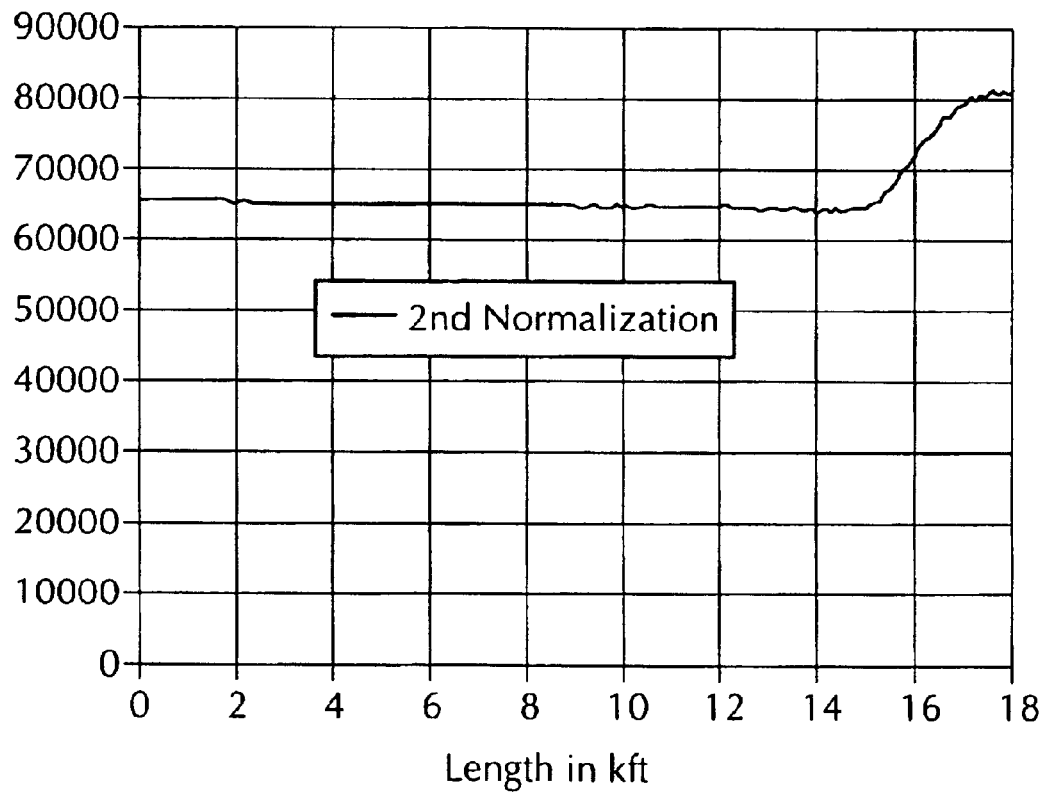
FIG. 6A shows a formula and a table of gain coefficient of the Second Normalization according to Step 306 of FIG. 3.
FIG. 6B shows a graphical representation of the normalization results of the Second Normalization.

Step 306: Second Normalization: Multiplying the array by the Cable Attenuation Gain vs. Time per Wire-type gain constant according to the formula shown in FIG. 6A so as to eliminate the exponential backscatter of a normal line of FIG. 5B, thereby obtaining a generally horizontal line with one or more abnormality waveforms as shown in FIG. 6B.

Step 307: Removing average DC offset from FIG. 7B so as to level the amplitude of the line in FIG. 7B to 0 except at the one or more abnormality waveforms.

Step 308: Third Normalization: Multiplying the array by the Trace Attenuation Gain vs. Time per Wire-type gain constant according to the formula shown in FIG. 8A so as to amplify the abnormality waveforms and to better distinguish different types of abnormalities.

Step 309: Displaying the digital data obtained after the Third Normalization.

In contrast, the protocol for conducting the abnormality test in the prior art only involves the steps illustrated in the shaded boxes 301, 302, 304, 305 and 310 of FIG. 3, and they are conducted by a technician manually adjusting the equipment. In determining whether any abnormalities are present on the copper pair line, one implementation of the prior art would be to generate an AC voltage into the copper pair line at some known level and their frequencies range from 250 to 3000 Hz, measure the return current, and then plot the resulting data on an amplitude vs. cable length graph. The presence of abnormalities is generally represented by the occurrence of changes in the slope where each bump on the plot indicates some type of abnormality in a specific location of the line. As mentioned, a technician manually checks the gain table to adjust the three sets of 12 bit data lines in FIG. 5A into one set of 16 bit data line in FIG. 5B.

Figure 9A:
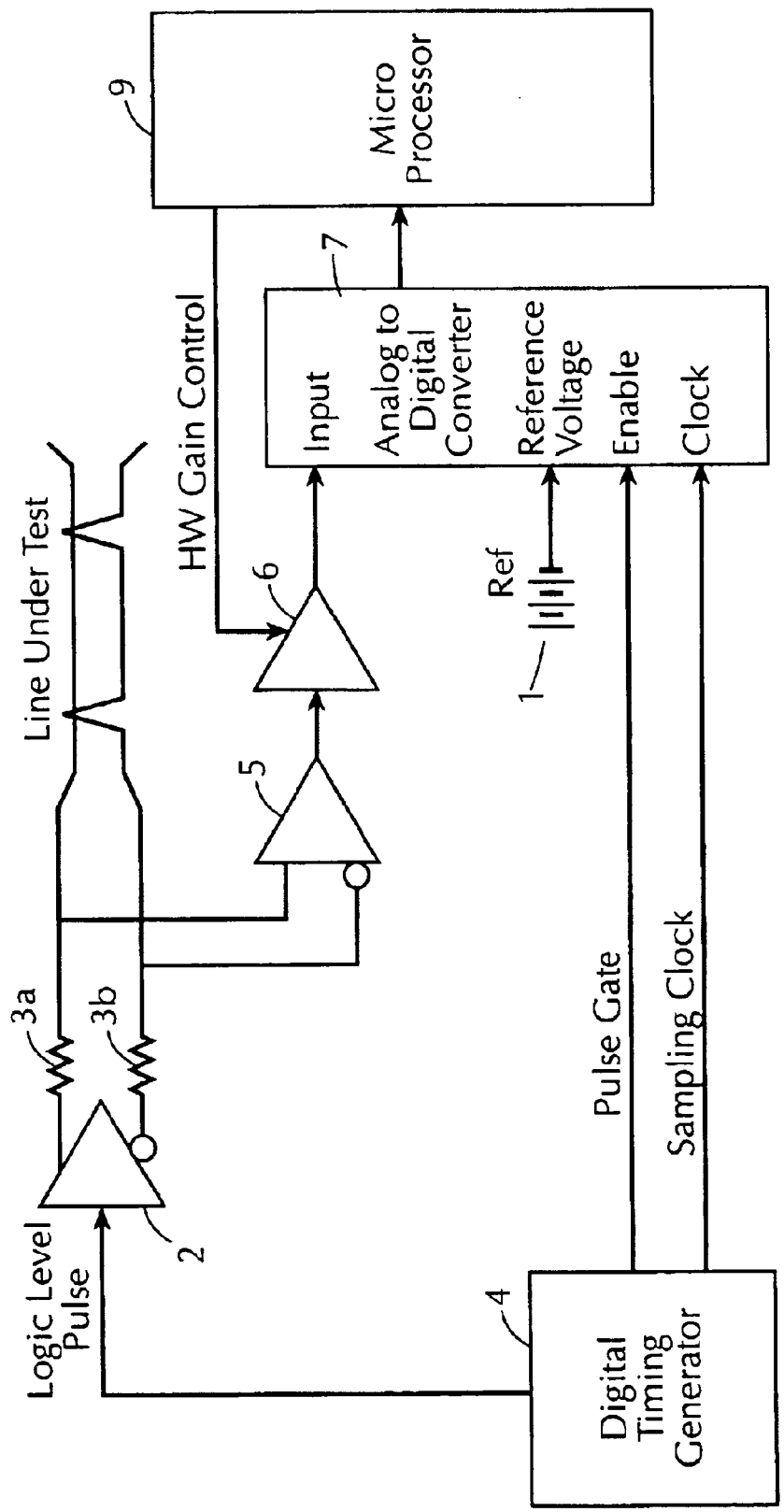
FIG. 9A shows one implementation for a traditional TDR.

In terms of the physical embodiment of a traditional TDR, as shown in FIG. 9A, all TDRs start with a pulse generator 1 which transmits a trace of energy onto the cable and receiving any reflected traces at a base location. For balanced lines as in the telephone system, the trace differentially drives the line with a line driver 2 through impedance matching resistors 3. This differential trace is transmitted into the line under test. Any faults will cause a reflected wave that will arrive at the differential receiver 5 at a later time. The adjustable gain controlled amplifier 6 attenuates or amplifies the return signal before it can be digitized by the A/D converter 7. These digitized samples are read into a microprocessor 9 and displayed for user interpretation. The distance to the discuiitinuity is calculated by measuring the elapsed time between the transmitted and received pulses. All digital timing is controlled with some sort of synchronous digital timing generator 4. A trace is created on a display screen showing the transmitted and reflected traces, by taking a plurality of horizontal samples along the copper pair line, and calculating a vertical value for each horizontal sample taken. Each horizontal sample is then converted to digital form and displayed on the screen.

Figure 9B:
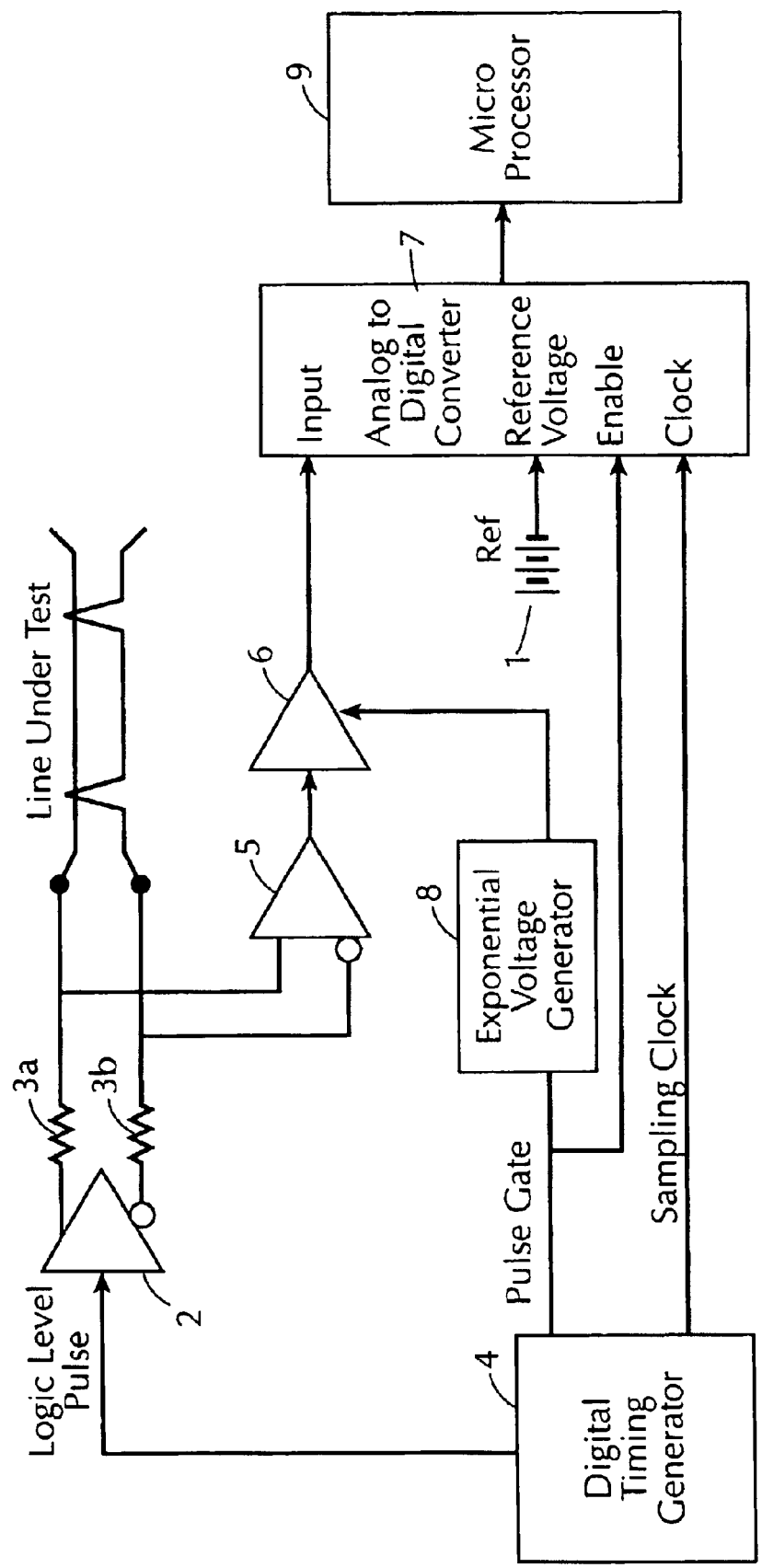
FIGS. 9B–9D show preferred implementations and applications of the present invention according to FIG. 3.

In the present invention, as shown in FIG. 9B, an Exponential Voltage Generator 8 is employed to implement solutions I, II to accomplish the first two unique normalization steps (steps 305–306 of FIG. 3) so as to bias the levels of the reflected pulses of various intensities, integrate them into an approximately smooth curve shown in FIG. 5B, and then to obtain a normalized waveform showing one or more abnormality bumps.

To realize a TDR of the above-described embodiment with a time varying gain proportional to the abnormality of a cable type, at least three solutions (via hardware, post-processing software or combination of HW & SW) are available and described below:

Solution I: Hardware Method #1 (See FIG. 9B)

With this method the "pulse gate" drives the Exponential Voltage Generator 8 which dynamically changes the gain of the voltage controlled adjustable gain amp 6 in a time varying manner. This method appears to be the most straightforward approach; however, matching the amplifier gain to the exponential decaying voltage in a repeatable fashion is rather difficult.

Figure 9C:
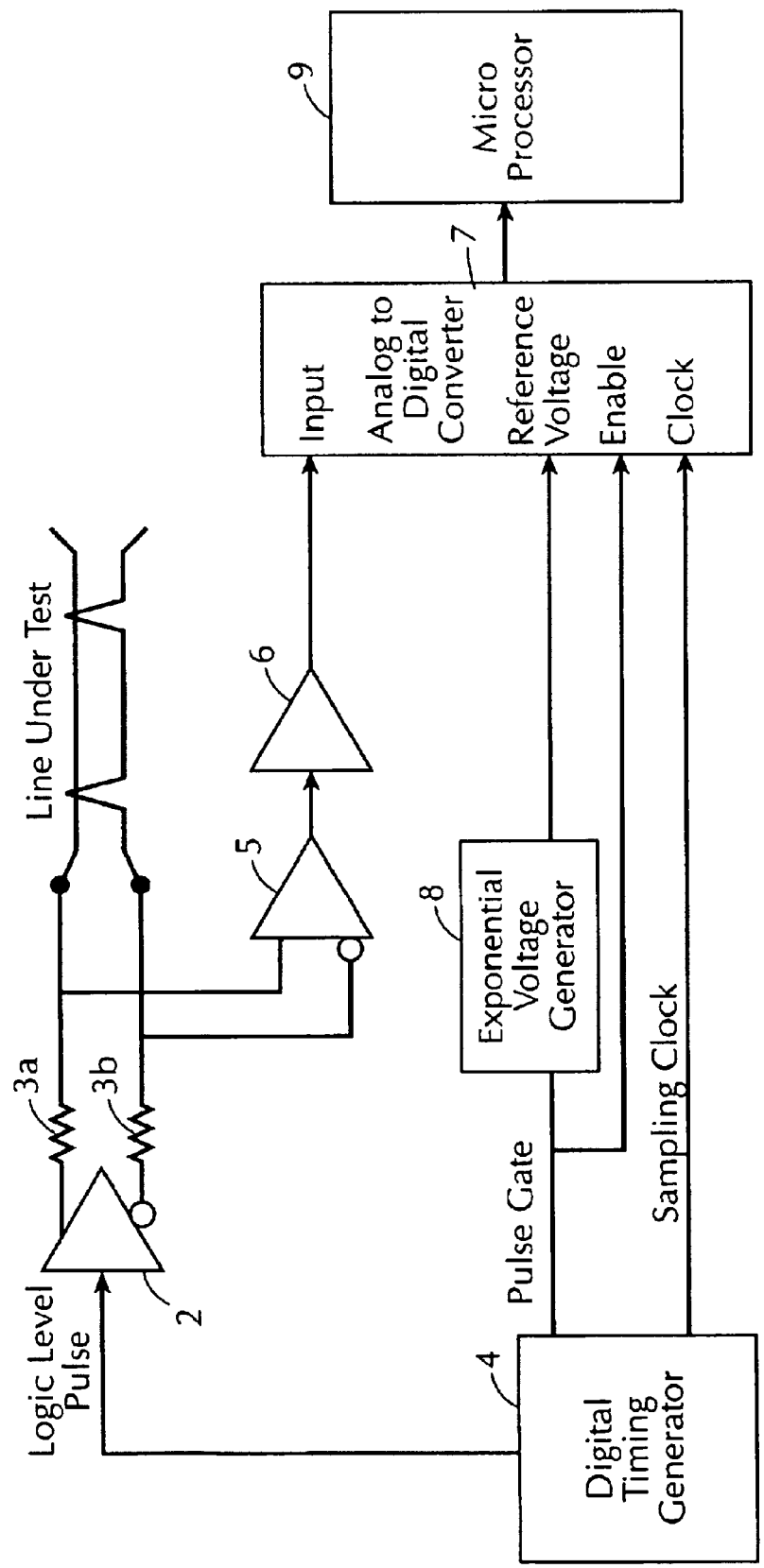

Solution II: Hardware Method #2 (See FIG. 9C)

With this method the "pulse gate" drives the Exponential Voltage Generator 8 which dynamically changes the gain of the A/D converter 7 by dynamically varying the reference voltage of converter 7 in a time varying manner. This method is easier then method #1 as the exponential decay of a simple RC circuit is nearly the decay required by the A/D converter reference voltage input. However as different cable types are to be tested, each type would require a different corresponding decay.

Figure 9D:
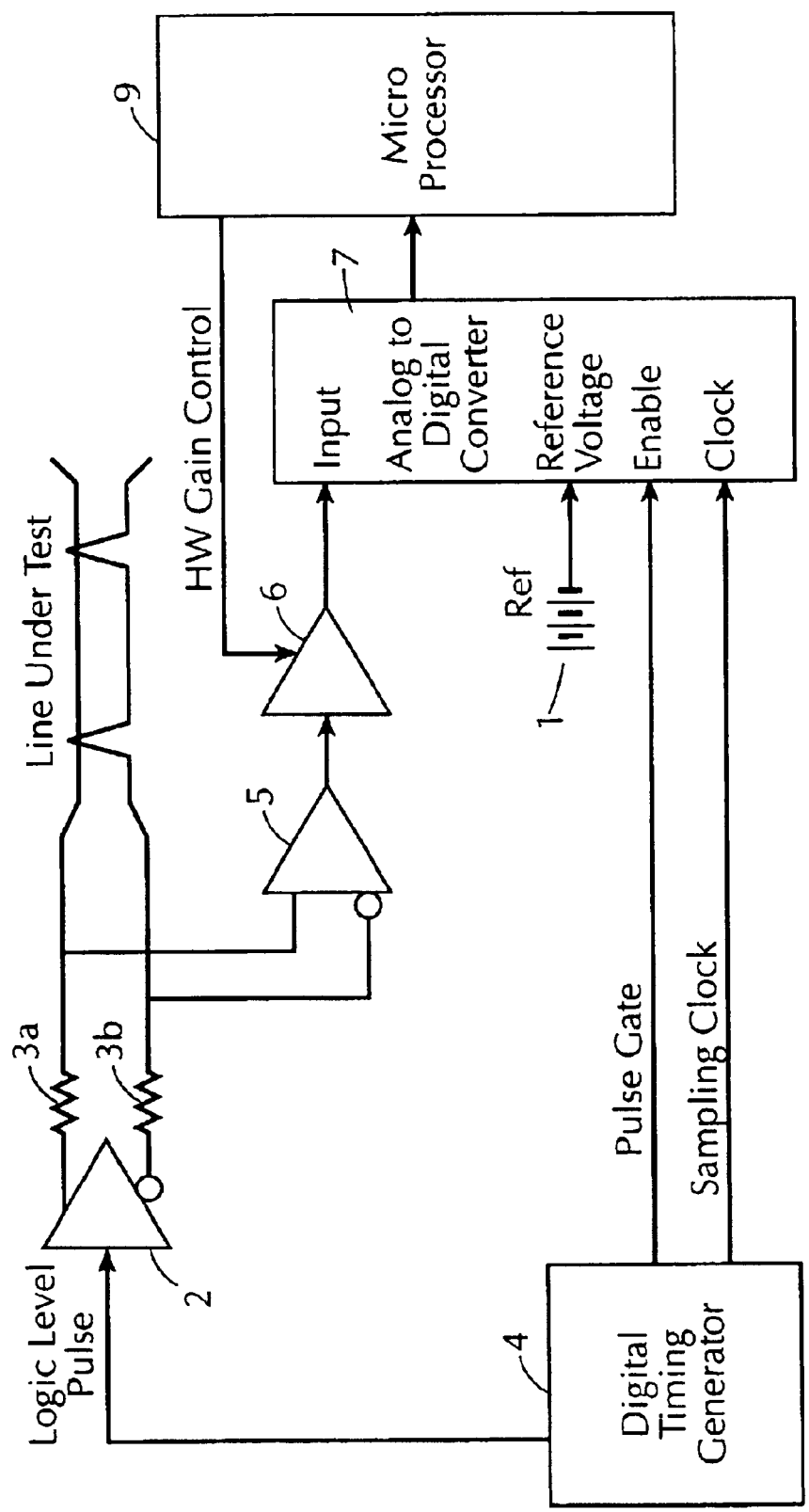

Solution III: Software Method (See FIG. 9D)

This method does not require the Exponential Voltage Generator 8, a voltage controlled adjustable gain amp 6, or a dynamically adjustable reference voltage for the A/D converter 7. Instead, the method requires digitized samples or "words" and a post process to divide the words by a predetermined table of cable loss for each cable type. The advantage of this method is less hardware as well as reliable control of the time varying gain.

In a preferred implementation of the present invention, the TDR incorporates the hardware and software necessary for determining the abnormality of a line based on both calculating the abnormality from complex signal analysis. Applicants have found that, under certain conditions, one method has distinct advantages over the other. Therefore, in order to maximize accuracy and efficiency, the present invention uses either method depending on the circumstances and on the desires/requirements of the user.

Through a processor, the reflected pulses are transformed such that they were displayed on the same observation range. However, Those lines can then normalized by a further data processing device or program to determine what characteristics of the copper pair line they represent.

The First Normalization of Step 305 is accomplished, in one embodiment, via the controller circuit, which includes a data/mathematical processor device or programs designed to separate a signal or mathematical representation of a reflected trace into its base component waveforms, by comparing the reflected traces of various frequencies with a set of gain & DC offset references so as to bias the levels of the reflected pluses of various intensities to be matched and shown as one approximately smooth curve shown in FIG. 5B. The equation for the First Normalization (t)=$1^{st}$ segment Raw Data/HWG1−Offset 1+$2^{nd}$ segment Raw Data/HWG2−Offset 2+$3^{rd}$ segment Raw Data/HWG3−Offset 3. The inputted traces originates from the testing conducted using the TDR component 209.

The Second Normalization of Step 306 is accomplished, in one embodiment, by the multiplication of the signal from Step 305 given approximately by the Gain2=$2.718^{(t/Kg2)}$, where t is time of sample in nS and Kg is the gain coefficient corresponding to the wire gauge and pulse width shown in the table of FIG. 6A. FIG. 6B illustrates the gain curve for a time varying gain TDR after the Second Normalization. The vertical axis is the amplitude of the signal in volts and the horizontal axis is the length in Kft of the copper pair wire to be tested for abnormalities. As shown in FIG. 6B, the gain remains relative constant until it approaches to the location of the abnormality.

Figure 10:
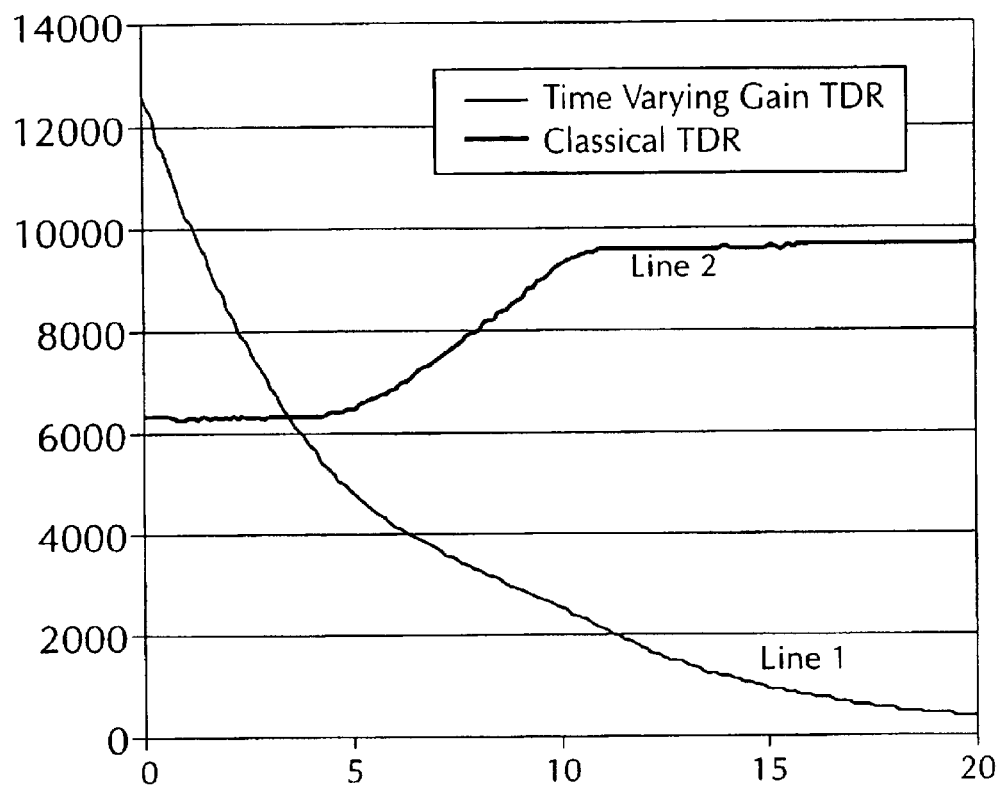
FIG. 10 contrasts signals with and without the Second Normalization according to the present invention.

FIG. 10 contrasts the signal with and without the Second Normalization. After the Second Normalization, the abnormality is 'amplified' into a platinum in line 2, which is much more clearer than the insignificant slope changes in line 1.

The DC offset removing step in 307 offsets a direct current portion form the signal. Effectively, the offset in the range of x-y volts is filtered from the waveforms resulting in FIG. 7B, $2^{nd}$ Normalization DCO(t)=$2^{nd}$ Normalization−Offset_$2^{nd}$_Norm.

Figures 8A, 8B:
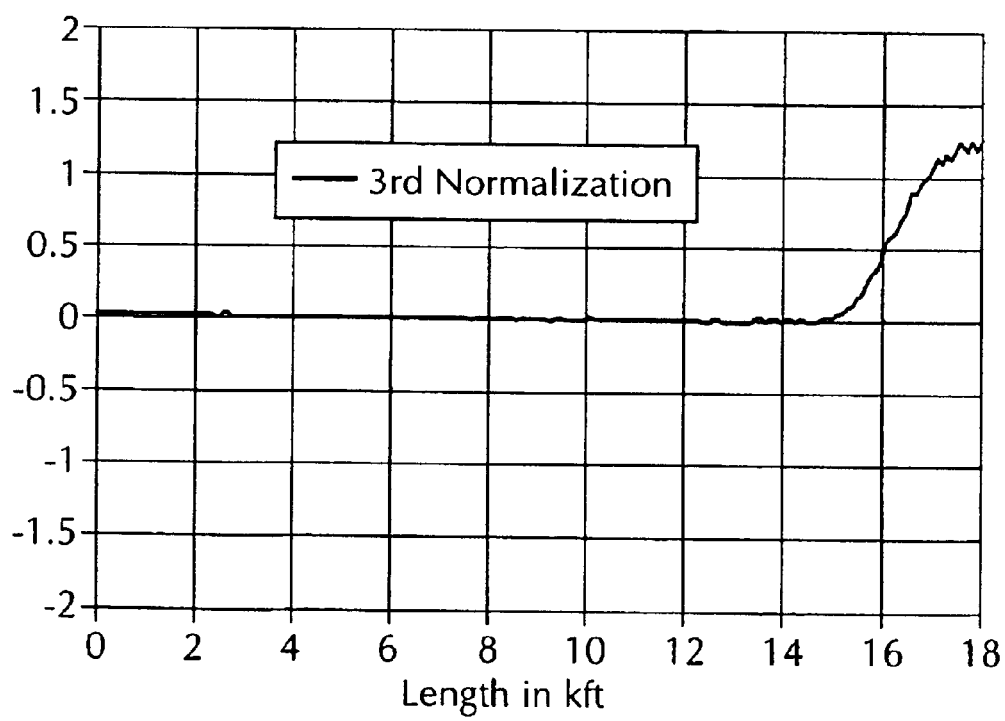
FIG. 8A shows a formula and a table of gain coefficient of the Third Normalization according to Step 308 of FIG. 3.
FIG. 8B shows a graphical representation of the reflected waveform after the third normalization.

The Third Normalization of Step 308 is accomplished, in one embodiment, by the multiplication of the signal from Step 307 given approximately by the 3rd Normalization (t)=$2^{nd}$ Normalization DCO*Gain3; Gain3=$2.718^{(t/Kg3)}$, where t is time of sample (trace frequency) in nS and Kg is the gain coefficient corresponding to the wire gauge and pulse width shown in the table of FIG. 8A. FIG. 8B illustrates the gain curve for a time varying gain TDR after the Second Normalization. The vertical axis is the amplitude of the signal after mathematical manipulation and the horizontal axis is the length in Kft (as compensated for VOP) of the copper pair wire to be tested for abnormalities. As shown in FIG. 8B, the gain remains relatively constant until it approaches to the location of the abnormality.

The output from Step 305 can be mathematically manipulated, either manually or within the controller circuit 213, to output a graphical representation of the signal characteristics of the copper pair line, such as the formula B, C and D.

The gain modified by the normalization process is characterized by the gain coefficient factor, Kg. The numerical variation in Kg adjusts gains to the final multiplied signal. As noted above, the wire gauge, temperature and cable construction type are parameters that affect Kg. The inclusion of these parameters in the calculations will improve the accuracy of the analysis. However, Applicants have found that the lack of actual values for these parameters does not prevent the analysis from being conducted nor from generating valid data, as estimates of these parameters can be used in the analysis.

Figures 7A, 7B:
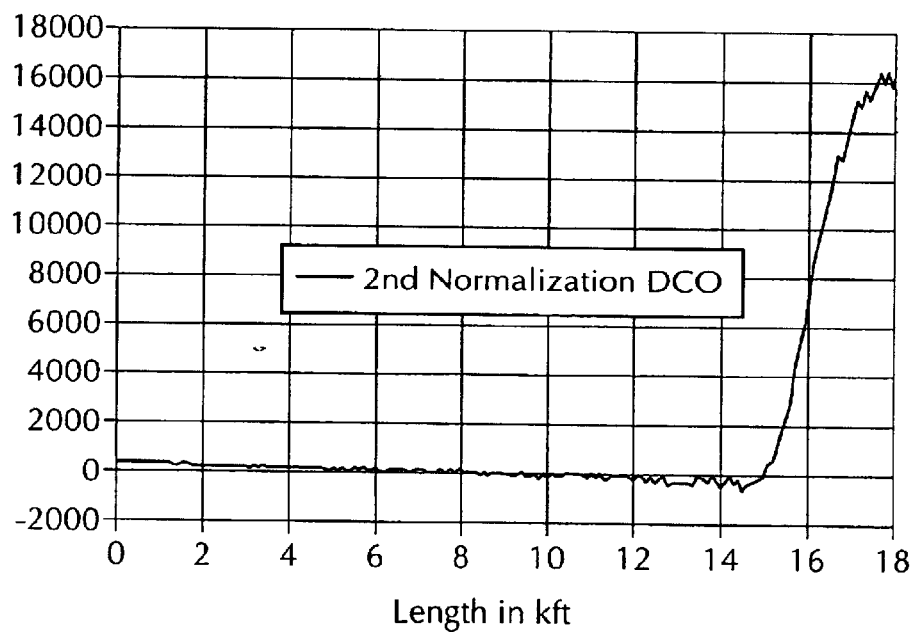
FIG. 7A shows a formula and a table of gain coefficient of the DC Offset of the Second Normalization according to Step 307 of FIG. 3.
FIG. 7B shows a graphical representation of the DC Offset normalization results of the Second Normalization.

FIGS. 6A, 7A and 8A show that the gain coefficient Kg generally increases with the increase of the pulse width, but it generally decreases with the increase of the wire gauge, which is a series of experimental figures. For example, if the wire gauge is 19 and the pulse width is 250 nS, then Kg on the formula needs to be set at 2,489.

As an output trace, the controller circuit 213 will convert the characteristic data results generated by the processor 213a and display them on the display 215. Depending on the requirements of the user, the data results are presented as either raw mathematical or formula data, graphically represented as equivalent circuit diagrams of the copper pair line's characteristics, and/or graphically represented as part of an overall diagram on the display 215 of the plant map of one or more copper pair lines connected to or originating from a specific CO or cross-box.

Figure 11:
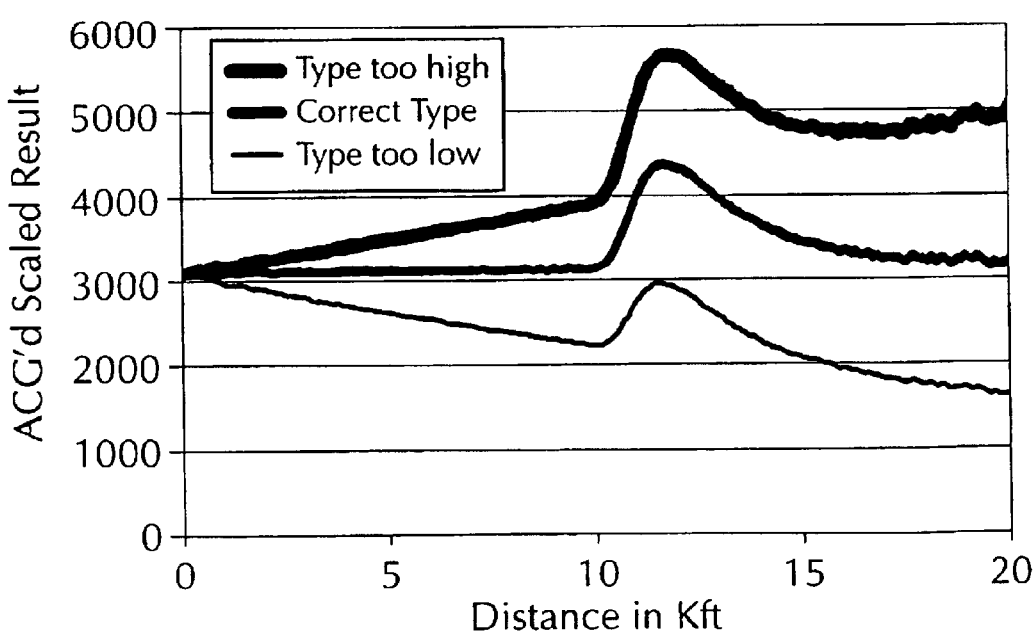
FIG. 11 shows the ability of the invention to detect the cable type with an open fault.

With respect to the cable type choosing step 301, the user simply inputs the data on a cable to be tested into the system. If the user inputs parameters different from those of the cable actually being tested, the display will deviate from a horizontal level as FIG. 11. FIG. 11 shows the ability of the invention to detect the cable type with an open fault.

Detailed analyses of the return trace waveforms will reveal many of the characteristics of the line being tested. With lines that have few or no unusual configurations (i.e., no bridge taps, no change in wire gauge, no physical damage), those characteristics can easily be measured and quantified since specific return trace waveforms will be indicative of certain characteristics, as known in the art. However, with lines that do have complex configurations, complex trace analyses would have to be conducted on their return trace waveforms, using algorithms and mathematical processes to identify and/or model the individual components of the measured waveform. The measurements and calculations as discussed below employ unique algorithms to level the amplitude of reflected traces within a specific range to show abnormalities to be compared with an abnormalities data bank for the most likely impairments. In particular, the candidates with the largest area and those that were found in the greatest number of traces. Those abnormalities not meeting that criteria are eliminated as being minor perturbations that should not be counted as true impairments.

Figure 12:
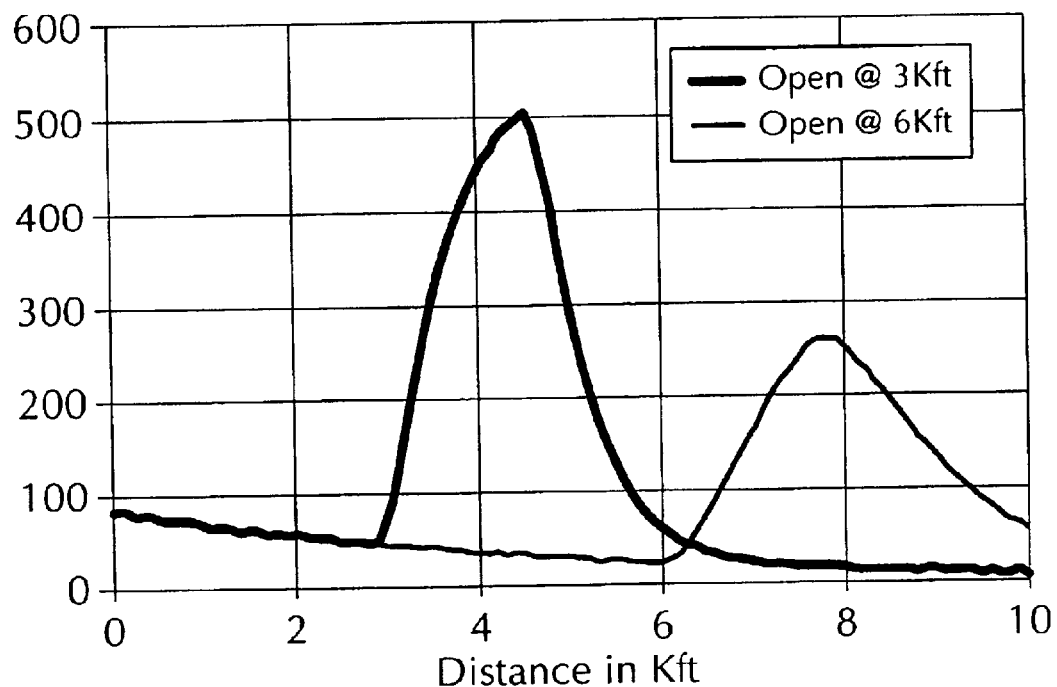
FIG. 12 shows an open fault trace (after being processed through the First Normalization step).
Figure 14:
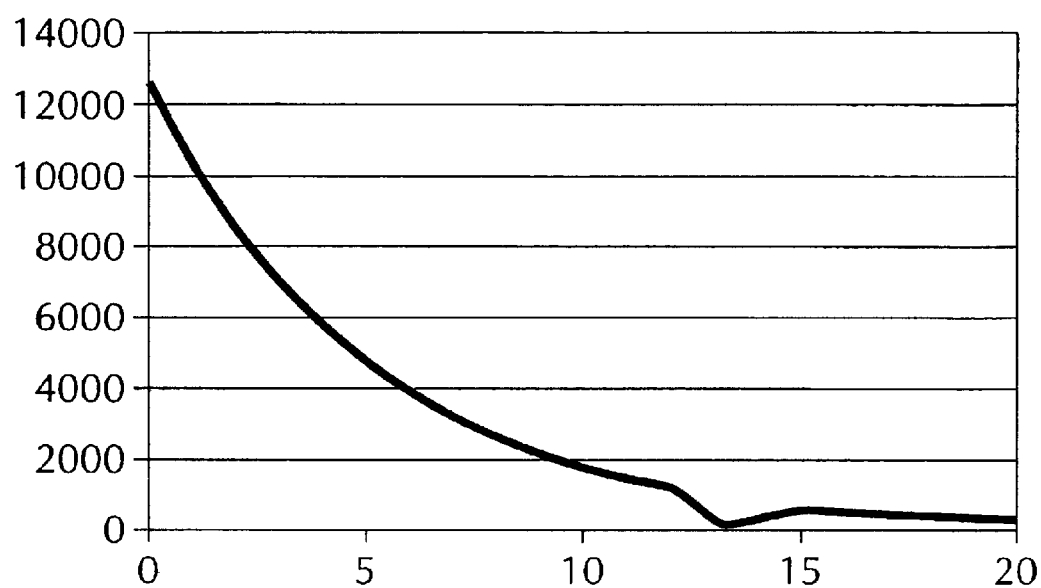
FIG. 14 shows a short fault trace (after being processed through the First Normalization step).
Figure 16:
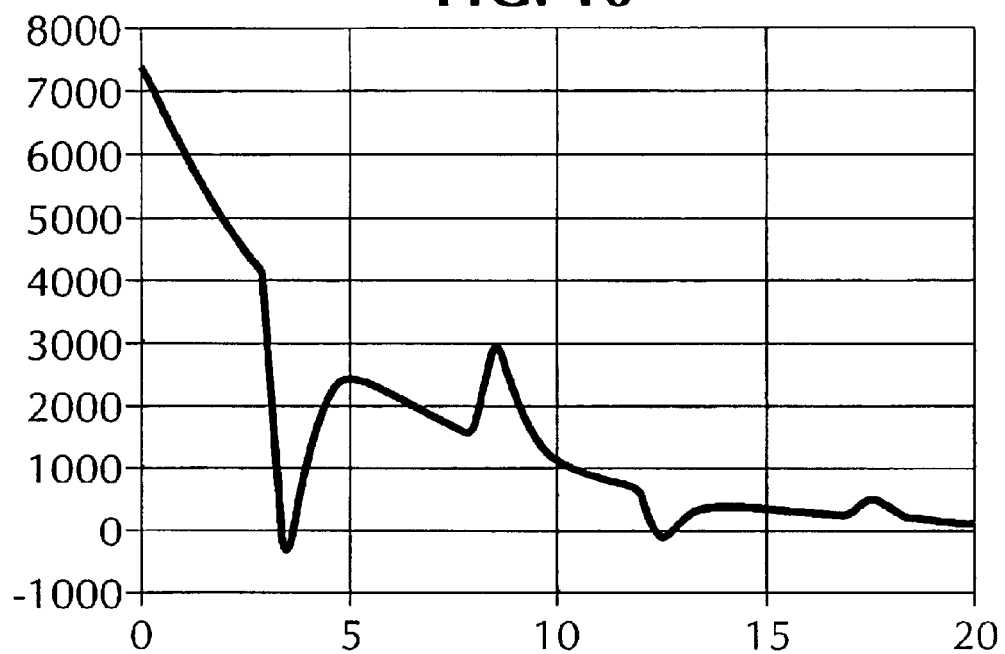
FIG. 16 shows a bridge-tapped fault trace (after being processed through the First Normalization step).

FIGS. 12, 14 and 16 show an open, short and bridge-tapped fault respectively (after the First Normalization).

Figure 13:
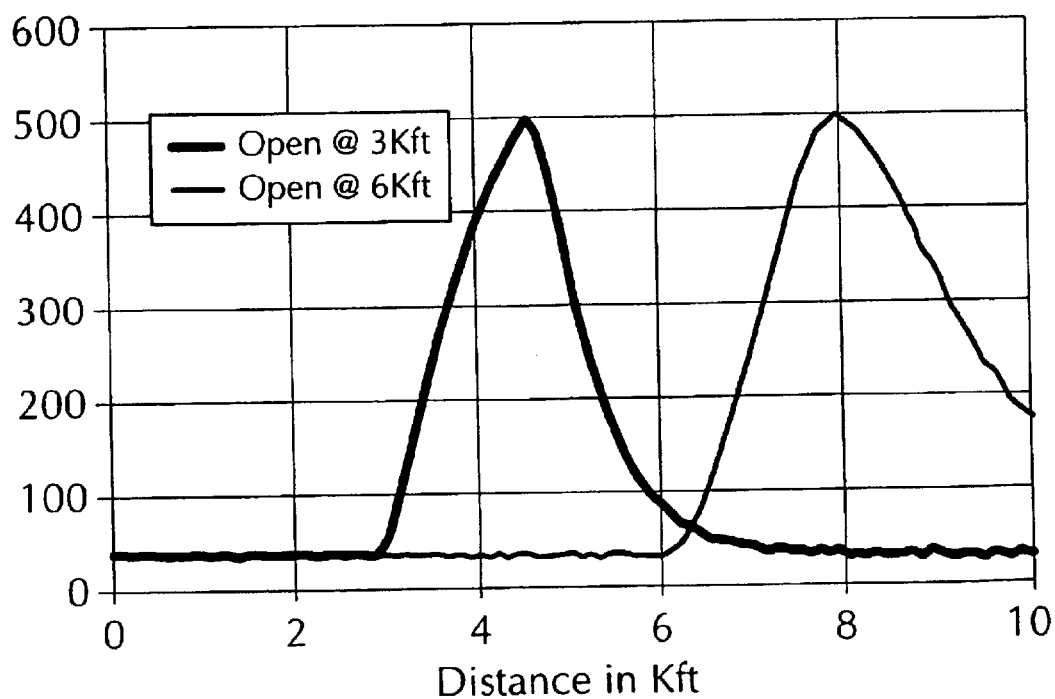
FIG. 13 shows an open fault trace (after being processed through the Second Normalization step).
Figure 15:
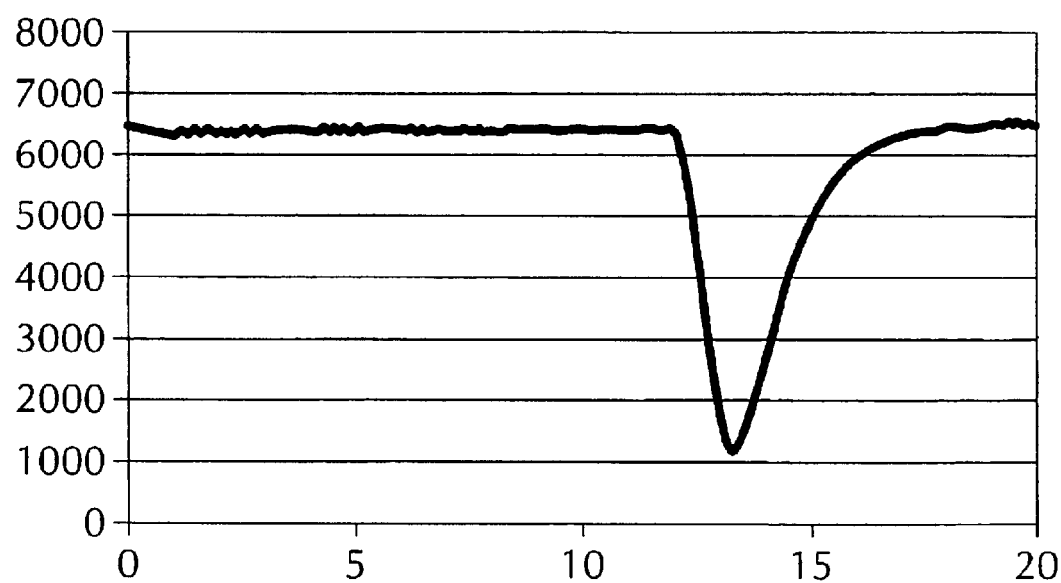
FIG. 15 shows a short fault trace (after being processed through the Second Normalization step).
Figure 17:
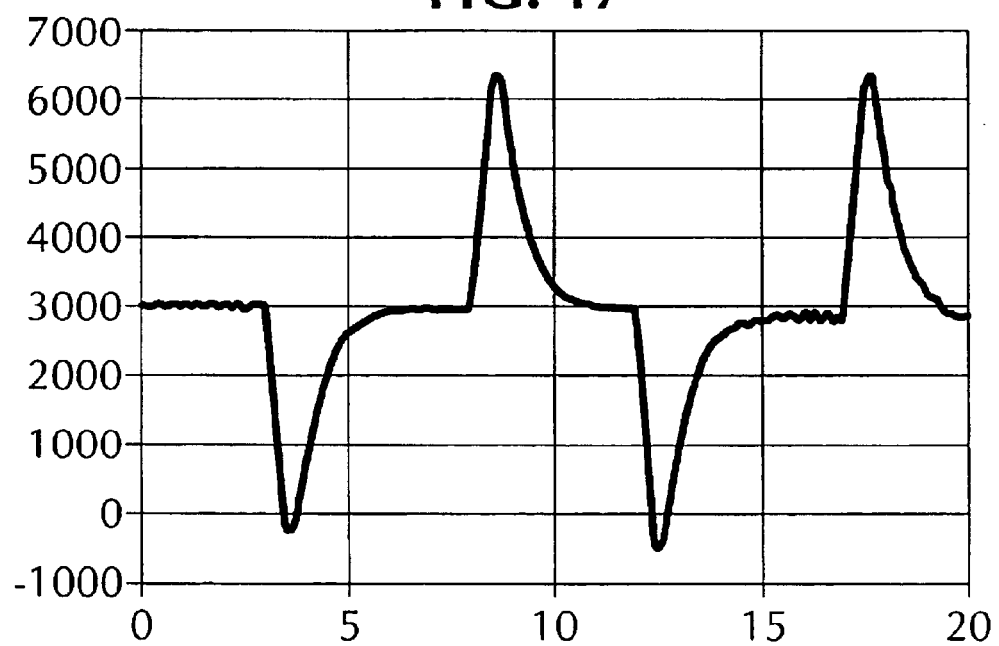
FIG. 17 shows a bridge-tapped fault trace (after being processed through the Second Normalization step).
Figure 18:
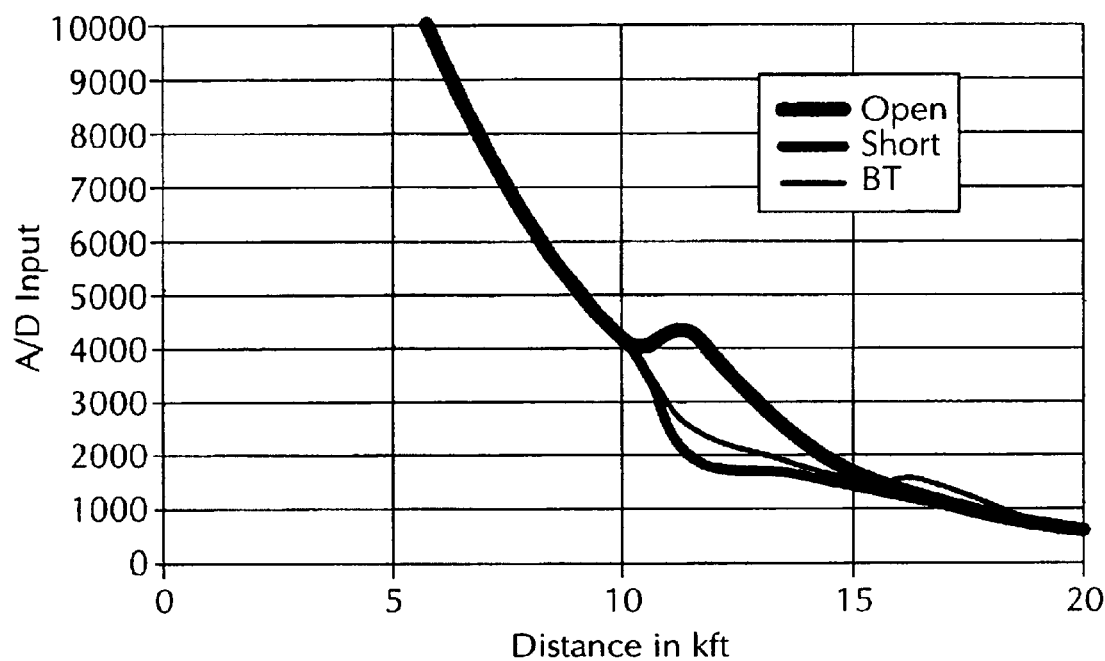
FIG. 18 shows traces of different types of faults expressed in different shapes (after being processed through the First Normalization step).
Figure 19:
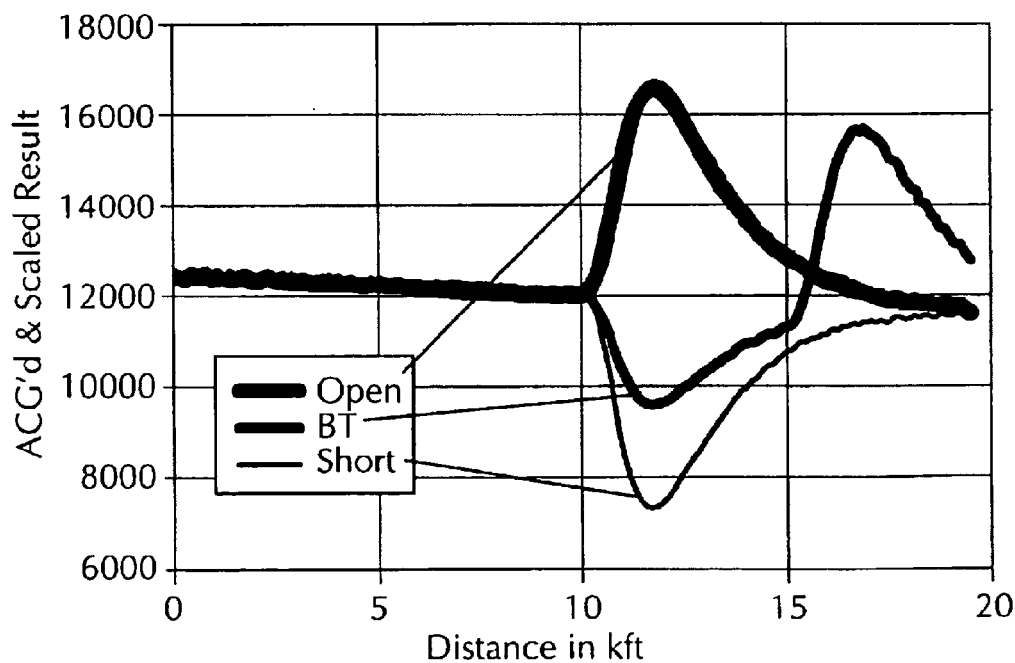
FIG. 19 shows traces of different types of faults expressed in different shapes (after being processed through the Second Normalization step).

FIGS. 13, 15 and 17 show those faults after the Second Normalization. To contrast the different shapes expressed by different types of faults, three output lines are shown on FIG. 18 (after the First Normalization) and 19 (after the Second Normalization). FIG. 19 also evidences one advantage of the present invention, reducing the back-scattered effect. Furthermore, FIGS. 13, 15, 17 and 19 contrast the signals in FIGS. 12, 14, 16 and 18 with the effect of the Second Normalization. After the Second Normalization, the abnormality is 'amplified' into much more clearer lines.

If the reflected trace were to return with an time varying amplification near the shape and level of the original trace or a smooth exponent graphical representation of the original trace with a gradual drop in amplitude, this would indicate that little or no change in the impedance along the length of the line was encountered, thereby indicating no substantial faults or damage present. On the other hand, a reflected trace with a substantial slope change would show a change in the impedance of the line that then indicates that a abnormality along the line, such as damage to the copper cables, is present resulting in a partial reflection of the original trace. Prominent "short" in the graphical representation would indicate the presence of short circuits (e.g., drop in impedance), while prominent "positive bump or slope change" in the graphical representation would indicate an open circuit condition (e.g., increase in impedance). Bridged taps, water, poor splices or gauge changes are all different forms of either "shorts" or "opens" in the line.

The time difference related to the partial reflection would be indicative of the distance between the starting point and the location of the abnormality. In addition to the type of analysis discussed above, other characteristics of the return trace (i.e., whether the return trace is in phase or out of phase, whether the return trace the same polarity or the inverse of the original) may be indicative of other conditions of the line. However, as one of skill in the art will understand, the information one may derive from these characteristics will vary depending on the construction of and algorithm used by the TDR implemented in the system of the present invention.

For example, a custom-programmed abnormality modeling software simulates the equivalent abnormality of the line would then be used to analyze any to-be-tested copper pair lines. The characteristics of the abnormalities of the copper pair line are estimated indirectly by comparing the reflected trace with a library of already known abnormalities; in particular, the comparison is between the complex impedance represented by the return trace signal and known pluses that represent known abnormalities. The implementation involves the use of a memory or data bank connected to or accessible by controller circuit 213. In using the data bank, the controller circuit 213 uses a comparison device or algorithm to compare the known in the data bank with the reflected trace from the TDR device 209. In essence, the comparison device would incorporate a system for searching the most relevant known abnormalities and comparing the characteristics of only those known abnormalities with the reflected trace. One implementation for the bank of known abnormalities uses a plurality of known copper pair lines. That bank of known wires can be supplemented with custom-designed copper pair wires derived from research, experimentation, simulation and/or field data.

In one implementation of the invention as shown in FIG. 2A, components 201–211 are incorporated into a testing equipment 20', 20" implemented as a single, dedicated testing device that includes a controller circuit 213 electrically connected to each of the components 201–211. The control circuit 213 includes a microprocessor, a digital signal processor (DSP) or other data processing device for receiving input data from each of the components 201–211, processing the input data so as to generate characteristic data on the copper pair line being tested, and outputting the characteristic data in a form that a user would understand. In particular, that testing device further includes a display device 215 or other know output mechanism through which the control circuit would display the characteristic data in a representative and user-understandable fashion.

Components 201–211 in this implementation embody either separate test circuit devices that generate data that is then inputted into the controller circuit 213, or simply the testing elements or probes for performing their respective functions. In that regard, controller circuit 213 is implemented with the conventional hardware/software to first generate/output test signals (where appropriate), and then receive/interpret input signals from the test elements or probes. Even more, with functions such as load coil testing, longitudinal balance testing and time domain reflectometry, as noted above, components 201–211 may be implemented as a single testing element or probe 219 (See FIG. 2C) that is designed to output as well as receive the appropriate signals for conducting the various tests, thereby minimizing the number of different components needed. In such an implementation, the individual components 201–211 would be furthered embodied in software programmed into the controller circuit 213 so as to control the testing element or probe 219.

Figure 2B:
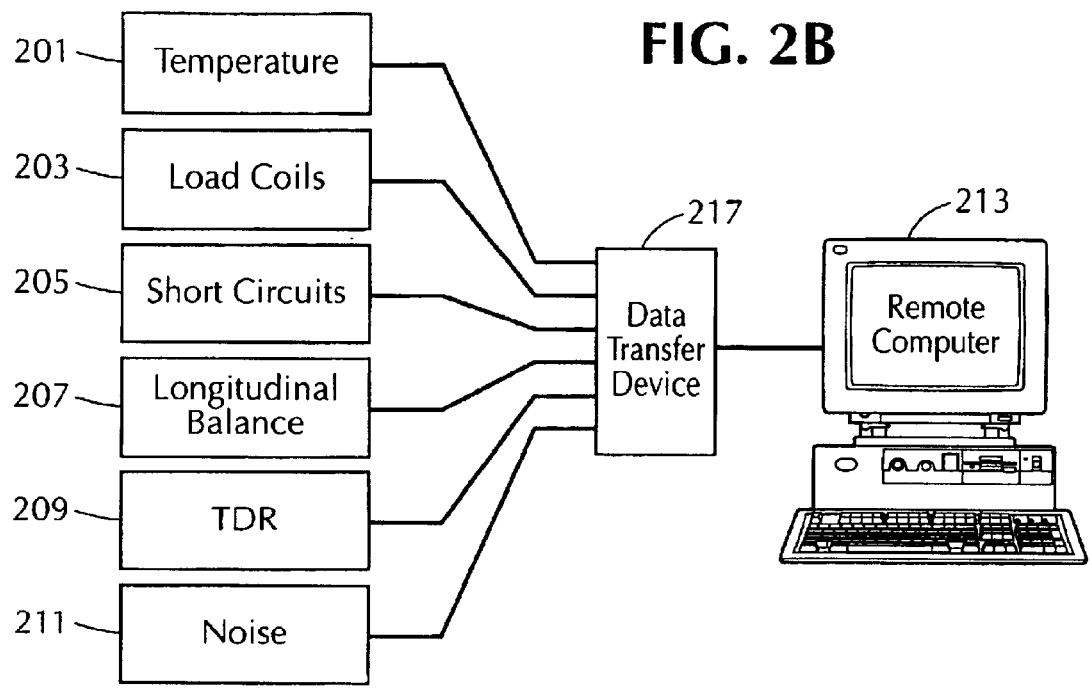
FIG. 2B is a system block diagram of an alternative implementation for the structural and operational components of the present invention.
Figure 2C:
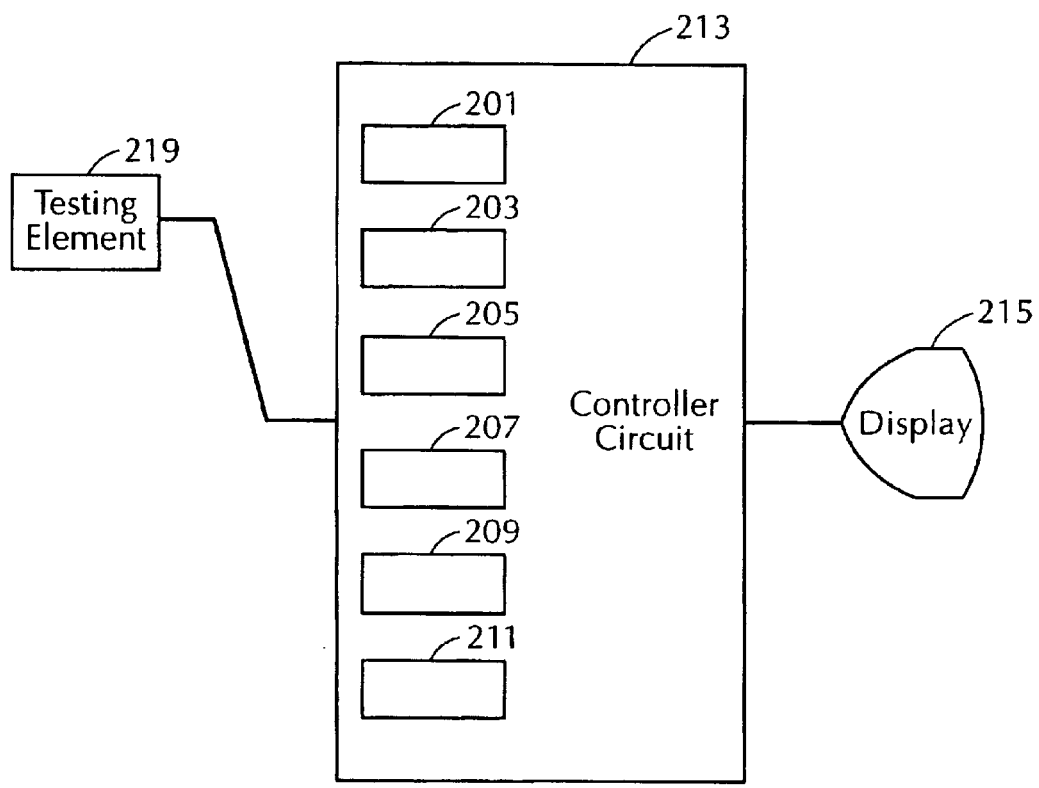
FIG. 2C is a system block diagram of a further alternative implementation for the structural and operational components of the present invention.

Alternatively, as illustrated in FIG. 2B, the controller circuit 213 can be implemented as a remotely-connected computer (e.g., desktop computer, laptop computer, mainframe, electronic controller) that communicates with the components 201–211 via hardwire cable, RF communication, infrared communication, laser communication or any other input/output data transfer device that one of skill in the art would deem appropriate under the circumstances. The components 201–211 are then each implemented as standalone instruments connected via a corresponding input/output data transfer device 217 so as to communicate data to/from the controller circuit 213. The components 201–211 may also be implemented as the testing elements or probes for performing their respective functions. Again, with functions such as load coil testing, longitudinal balance testing and time domain reflectometry, the same testing element or probe 219 may be used to perform a plurality of different tests. As with the prior implementation discussed above, the controller circuit 213 would then have to implement the necessary hardware and software to communicate and/or control this implementation of the components 201–211.

As one of skill in the art would understand, the data transfer device 217 may be (a) a plurality of communication devices each connected to one of the components 201–211, if separate components, and thus independently connected to the control circuit 213; (b) an integrated communication device connected to transfer data signals to and from the components 201–211 and to transfer data to and from the control circuit 213; (c) an integrated communication device connected to transfer data signals to and from the testing element or probe 219 and to transfer data to and from the control circuit 213; or (d) an input/output circuit device integral to the controller circuit 213 (i.e., a USB device) such that each of the components or a single testing element or probe art connected directly to or communicate directly with the controller circuit 213.

As an even further alternative, the invention may be implemented manually by the use of conventional implementations of each of the components 201–211 that are used in sequence in accordance with the testing protocol of the present invention, as will be explained further hereinbelow. A user would take the data outputted by each of the separate components, and input them into a data processing device (e.g., the implementation of the controller circuit 213) in order to generate the desired data. This data may then be filtered through a set of pass/fail criteria, being summarized to single pass/fail result, allowing even a very unskilled person to determine a line fit for DSL service with a high degree of accuracy and confidence.

The present invention is not to be considered limited in scope by the preferred embodiments described in the specification. Additional advantages and modifications, which will readily occur to those skilled in the art from consideration of the specification and practice of the invention, are intended to be within the scope and sprit of the following claims.

What is claimed:

1. A method for use with a time domain reflectometer (TDR) of displaying abnormalities of a non-optical wire communication line, comprising the steps of:

transmitting from a TDR at least one pulse into a wire communication line;

receiving a reflected trace from the wire communication line;

exponentially adjusting the reflected trace so as to reduce an exponential gain decay of the reflected trace; and displaying the adjusted trace.

2. The method according to claim 1, wherein the step of exponentially adjusting the reflected trace includes amplifying the reflected trace according to an exponential decay as a function of time to reduce an exponential gain decay of a no-fault wire communication line.

3. The method according to claim 1, after the step of exponentially adjusting the reflected trace, further comprising:

offsetting a direct current portion from the adjusted trace; and exponentially adjusting the offset trace for a second time so as to amplify the abnormalities present in the offset trace.

4. The method according to claim 1, prior to the step of exponentially adjusting, further comprising removing abrupt transitions to produce a smooth reflected trace.

5. The method according to claim 1, after the step of exponentially adjusting the reflected trace, further comprising offsetting a direct current portion from the adjusted trace.

6. A system for displaying abnormalities of a non-optical wire communication line, the system comprising:

a pulse generator operable to generate at least one pulse for transmission on a wire communication line;

a receiver operable to receive a reflected trace from the wire communication line;

a processor operable to exponentially adjust the reflected trace so as to reduce an exponential gain decay of the reflected trace; and a display operable to display the adjusted trace.

7. The system according to claim 6, wherein the processor exponentially adjusts the reflected trace by amplifying the reflected trace according to an exponential decay as a function of time to reduce an exponential gain decay of a no-fault wire communication line.

8. The system according to claim 7, further comprising an exponential voltage generator operable to generate the exponential decay as a function of time.

9. The system according to claim 6, wherein the processor is further operable to:

offset a direct current portion from the adjusted trace; and exponentially adjust the offset trace for a second time so as to amplify the abnormalities present in the offset trace.

10. The system according to claim 6, wherein the process is further operable to remove abrupt transitions to produce a smooth reflected trace prior to exponentially adjusting the reflected trace.

11. The system according to claim 6, wherein the processor offsets a direct current portion from the adjusted trace after the reflected trace is exponentially adjusted.

* * * * *